United States Patent
Jang

(10) Patent No.: US 7,282,460 B2
(45) Date of Patent: Oct. 16, 2007

(54) TRANSFER CHAMBER FOR CLUSTER SYSTEM

(75) Inventor: Geun-Ha Jang, Gyeonggi-do (KR)

(73) Assignee: Jusung Engineering Co., Ltd., Kwangju-shi (KR)

( * ) Notice: Subject to any disclaimer, the term of this patent is extended or adjusted under 35 U.S.C. 154(b) by 308 days.

(21) Appl. No.: 10/859,893

(22) Filed: Jun. 2, 2004

(65) Prior Publication Data

US 2004/0240983 A1    Dec. 2, 2004

(30) Foreign Application Priority Data

Jun. 2, 2003    (KR)    ............... 10-2003-0035350

(51) Int. Cl.
  *H01L 21/677*    (2006.01)
(52) U.S. Cl. .............. 438/800; 414/217; 414/220; 34/287
(58) Field of Classification Search ........... 438/800; 414/217, 220; 34/287
See application file for complete search history.

(56) References Cited

U.S. PATENT DOCUMENTS

| 6,045,620 | A | * | 4/2000 | Tepman et al. ............. 118/733 |
| 6,056,849 | A | * | 5/2000 | Straemke ............... 156/345.31 |
| 6,405,423 | B1 | * | 6/2002 | Donde .......................... 29/428 |
| 6,977,014 | B1 | * | 12/2005 | Stevens et al. ............. 118/719 |
| 2002/0005168 | A1 | * | 1/2002 | Kraus et al. ................ 118/715 |
| 2006/0051507 | A1 | * | 3/2006 | Kurita et al. ............ 427/248.1 |
| 2006/0101728 | A1 | * | 5/2006 | White et al. ................. 52/79.1 |

FOREIGN PATENT DOCUMENTS

KR    1020040090496    10/2004

* cited by examiner

*Primary Examiner*—W. David Coleman
(74) *Attorney, Agent, or Firm*—Marger Johnson & McCollom, P.C.

(57) ABSTRACT

A transfer chamber for a cluster system includes a first body, a second body attached at one side of the first body, and a cover combined with an upper portion of the first body. The transfer chamber further includes a third body at another side of the first body, wherein the third body has the same shape as the second body.

11 Claims, 3 Drawing Sheets

TRANSFER CHAMBER FOR CLUSTER SYSTEM

The present invention claims the benefit of Korean Patent Application No. 2003-0035350, filed in Korea on Jun. 2, 2003, which is hereby incorporated by reference.

BACKGROUND OF THE INVENTION

1. Field of the Invention

The present invention relates to an apparatus of manufacturing a semiconductor device, and more particularly, to a transfer chamber for a cluster system of manufacturing a semiconductor device.

2. Discussion of the Related Art

Due to rapid development in information technology, display devices have evolved to process and display increasingly large amounts of information. Flat panel display technologies have been recently conceived and developed for display devices having small thickness, light weight, and low power consumption. Among these technologies, a liquid crystal display (LCD) device has been spotlight as a substitution for a cathode ray tube (CRT) because of its superior resolution, color image display, and image quality, and is already widely used for notebook computers, desktop monitors, and other application.

The LCD device may include a plurality of pixels, in each of which a switching element may be formed to independently control the pixel. This LCD device is commonly referred to as an active matrix liquid crystal display (AM-LCD) device. A thin film transistor may be used as the switching element, and the LCD device including the thin film transistor is referred to as a thin film transistor (TFT) LCD device.

The TFT LCD device includes two substrates on which elements, such as electric field forming electrodes and thin film transistors, are formed as thin films. The elements are formed by repeatedly depositing a thin film and patterning the thin film through a photolithography process. The photolithography process includes a light exposing process for selectively exposing or covering the thin film, an etching process for selectively removing the thin film to have a predetermined shape, and a cleaning process for eliminating residues, wherein the cleaning process includes washing and drying.

Each process is performed within a processing chamber where the optimum conditions are made for the corresponding process. Recently, to deal with a plurality of substrates in a short time, a cluster system is used. The-cluster system includes processing chambers for carrying out the above processes and a transfer chamber for keeping the substrates and transporting or sending back the substrates.

The cluster system is also used for a manufacturing process of a semiconductor device, which includes repeated processes of depositing a thin film on a semiconductor substrate such as silicon wafer, patterning the thin film through the photolithography process and cleaning the patterned thin film. Here, objects treated within the cluster system may be referred to as substrates.

FIG. 1 is a schematic view of a related art cluster system. In FIG. 1, the cluster system includes a storing part 10, a loadlock chamber 20, a plurality of processing chambers 42, 44, 46 and 48, a preheating chamber 50, and a transfer chamber 30. In the storing part 10, a plurality of substrates (not shown) are kept. The loadlock chamber 20 has at least one slot to load the substrates temporarily. In the processing chambers 42, 44, 46 and 48, treatments for the substrates are performed. Before the substrates are loaded in one of the processing chambers 42, 44, 46 and 48 and are dealt with, the substrates are preheated in the preheating chamber 50. The transfer chamber 30 is connected to the loadlock chamber 20, the plurality of processing chambers 42, 44, 46 and 48, and the preheating chamber 50.

The transfer chamber 30 serves as a temporary storing place or passage that the substrates commonly pass through when the plurality of untreated substrates in the storing part 10 are dealt with through the loadlock chamber 20, the preheating chamber 50 and the processing chambers 42, 44, 46 and 48, respectively, and then are returned.

FIG. 2 illustrates the transfer chamber for the related art cluster system. In FIG. 2, the transfer chamber 30 includes a body 32 and a cover 38. The body 32 has an opening for combining with the cover 38. Loadlock chamber connecting portions 34 are formed at one side of the body 32, and a plurality of processing chamber connecting portions 35 are formed at other sides of the body 32, respectively.

The loadlock chamber connecting portions 34 and the plurality of processing chamber connecting portions 35 are connected to an inner space 36 of the body 35. Thus, a robot (not shown), which is equipped in the inner space 36, transports the substrates into the storing part 10, the loadlock chamber 20, and the processing chambers 42, 44, 46 and 48 of FIG. 1, and returns the substrates.

A size of the transfer chamber 30 as the temporary storing place or passage of the substrate depends on a size of the substrate. A substrate for a latest fifth generation LCD device has a size of about 1,100 mm×1,300 mm. According as the LCD device grows larger, a substrate for a sixth generation LCD device may have a size of about 1,500 mm×1,800 mm to 1,800 mm×2,000 mm. Therefore, the transfer chamber may have a maximum diagonal of about 4,200 mm.

However, since the transfer chamber is made of aluminum or stainless steel, it is difficult to manufacture the large transfer chamber as one body with other chambers. In addition, although the large transfer chamber is manufactured as one body with other chambers, there are disadvantages that manufacturing costs is increased and it is not easy to transport the chambers.

SUMMARY OF THE INVENTION

Accordingly, the present invention is directed to a transfer chamber for a cluster system of manufacturing a semiconductor device that substantially obviates one or more of problems due to limitations and disadvantages of the related art.

An advantage of the present invention is to provide a transfer chamber for a cluster system of manufacturing a semiconductor device that deals with a large size substrate and is separable.

Another advantage of the present invention is to provide a transfer chamber for a cluster system of manufacturing a semiconductor device that is manufactured at a low cost and is easily set up or transported.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a transfer chamber for a cluster system includes a first body, a second body attached at one side of the first body, and a cover combined with an upper portion of the first body. The transfer chamber further includes a third body at another side of the first body, wherein the third body has the same shape as the second body.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, the examples of which are illustrated in the accompanying drawings.

Figure 1:
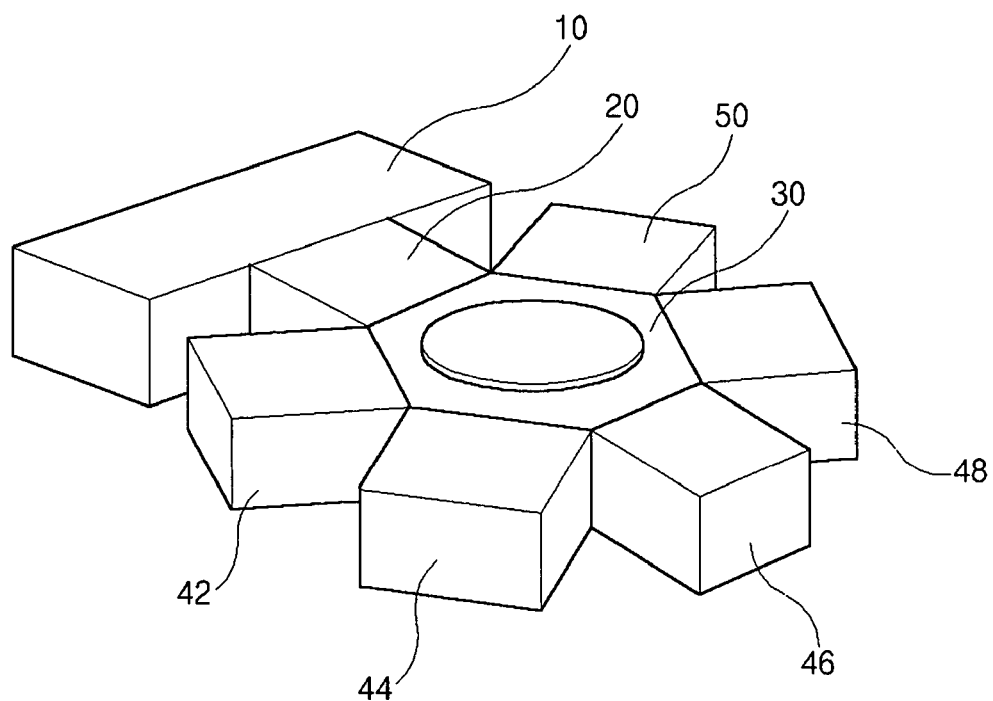
FIG. 1 is a schematic view of a related art cluster system.
Figure 2:
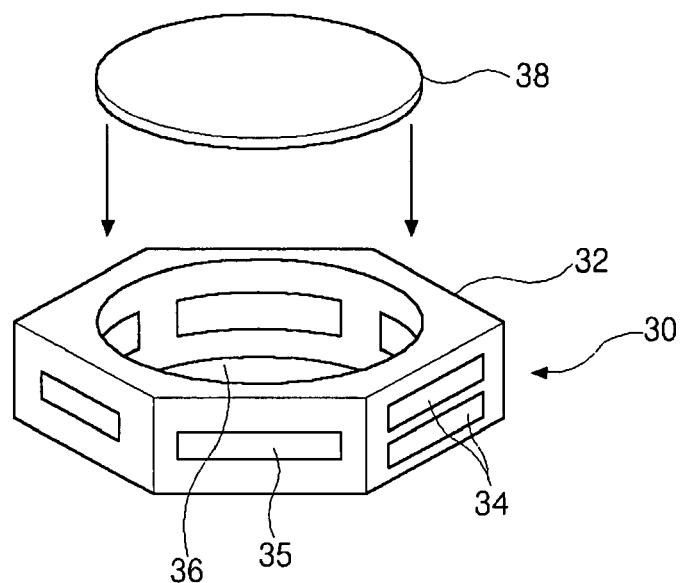
FIG. 2 is a view of illustrating a transfer chamber for the related art cluster system.
Figure 3:
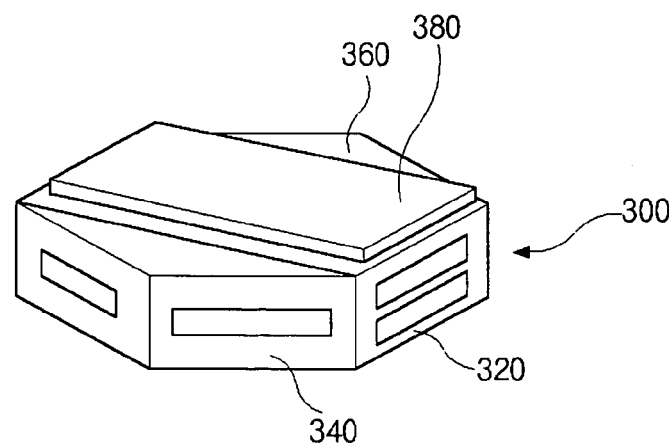
FIG. 3 is a schematic view of a transfer chamber according to a first embodiment of the present invention.
Figure 4:
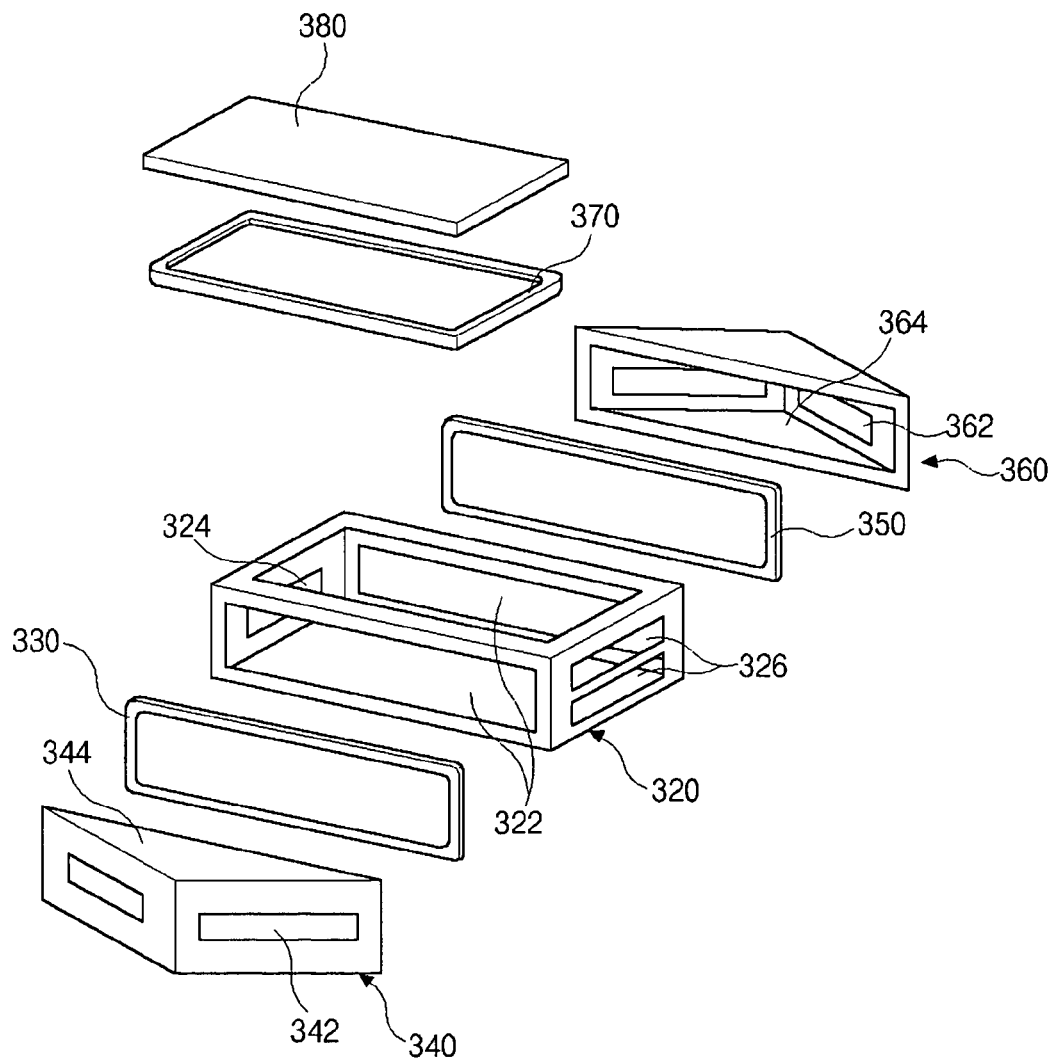
FIG. 4 is a schematic exploded view of the transfer chamber according to the first embodiment of the present invention.

FIG. 3 is a schematic view of a transfer chamber according to a first embodiment of the present invention and FIG. 4 is a schematic exploded view of the transfer chamber. The transfer chamber of the first embodiment may be connected to one loadlock chamber and five processing chambers.

In FIGS. 3 and 4, the transfer chamber 300 includes a first body 320, a cover 380, a second body 340 and a third body 360. The cover 380 is combined with an upper portion of the first body 320 in the context of the figure. The second and third bodies 340 and 360 are joined with sides of the first body 320 facing each other. O-rings 330, 350 and 370 are interposed between the first body 320 and the cover 380 and between the first body 320 and the second and third bodies 340 and 360 for sealing.

The first body 320 has a hexahedral shape. More particularly, the first body 320 is a rectangular parallelepiped. An upper opening is formed in an upper side of the first body 320 and is connected to the cover 380. Side openings 322 are formed at facing sides of the first body 320, and two loadlock chamber connecting portions 326 and a processing chamber connecting portion 324 are formed at other facing sides of the first body 320, respectively. The sides for the side openings 322 may be wider than the sides for the loadlock chamber connecting portions 326 and the processing chamber connecting portion 324. The first body 320 is combined with the second and third bodies 340 and 360 through the side openings 322. The loadlock chamber connecting portions 326 may be formed as one opening.

A robot (not shown) is equipped in the first body 320, and transports and returns substrates.

The second and third bodies 340 and 360 have a triangular prism shape. A side opening 364 is formed at one side of the third body 360, and although not shown in the figure, another side opening is formed at one side of the second body 340 facing the side opening 365 of the third body 360. Processing chamber connecting portions 342 and 362 are formed at other sides of the second and third bodies 340 and 360, respectively.

Spaces formed by combining the first body 320 with the second and third bodies 340 and 360 serve as a temporary storing place or passage while the substrates are transported or are returned. A preheating chamber (not shown) may be connected to the transfer chamber 300 through one of the processing chamber connecting portion 324 of the first body 320 and the processing chamber connecting portions 342 and 362 of the second and third bodies 340 and 360 to preheat the substrates before the substrates are dealt with in processing chambers (not shown).

A loadlock chamber (not shown) may be connected to one of the processing chamber connecting portions 342 and 362 of the second and third bodies 340 and 360, and a processing chamber (not shown) may be connected to the loadlock chamber connecting portion 326 of the first body 320.

O-rings 330, 350 and 370 are interposed between the first body 320 and the cover 380 and between the first body 320 and the second and third bodies 340 and 360. When the transfer chamber 300 is carried or repaired, the transfer chamber 300 is easily broken up according to an inverse assembly order. The O-rings 330, 350 and 370 are only one example and other connecting means may be used to combine the first body 320 with the cover and the second and third bodies 340 and 360.

The transfer chamber 300 of FIG. 3 has a hexagonal pillar shape, and is connected to six other chambers, for example, a loadlock chamber and five processing chambers. At this time, as stated above, the first body 320 of FIG. 4 has the hexahedral shape, and more particularly, the rectangular parallelepiped shape. The second and third bodies 340 and 360 have the triangular prism shape. According as the number of chambers combined with the transfer chamber 300 increases, the transfer chamber 300 may have other shapes such as heptagonal and octagonal pillar shapes. The shapes of the second and third bodies 340 and 360 also vary depending on the shape of the transfer chamber 300.

Figure 5:
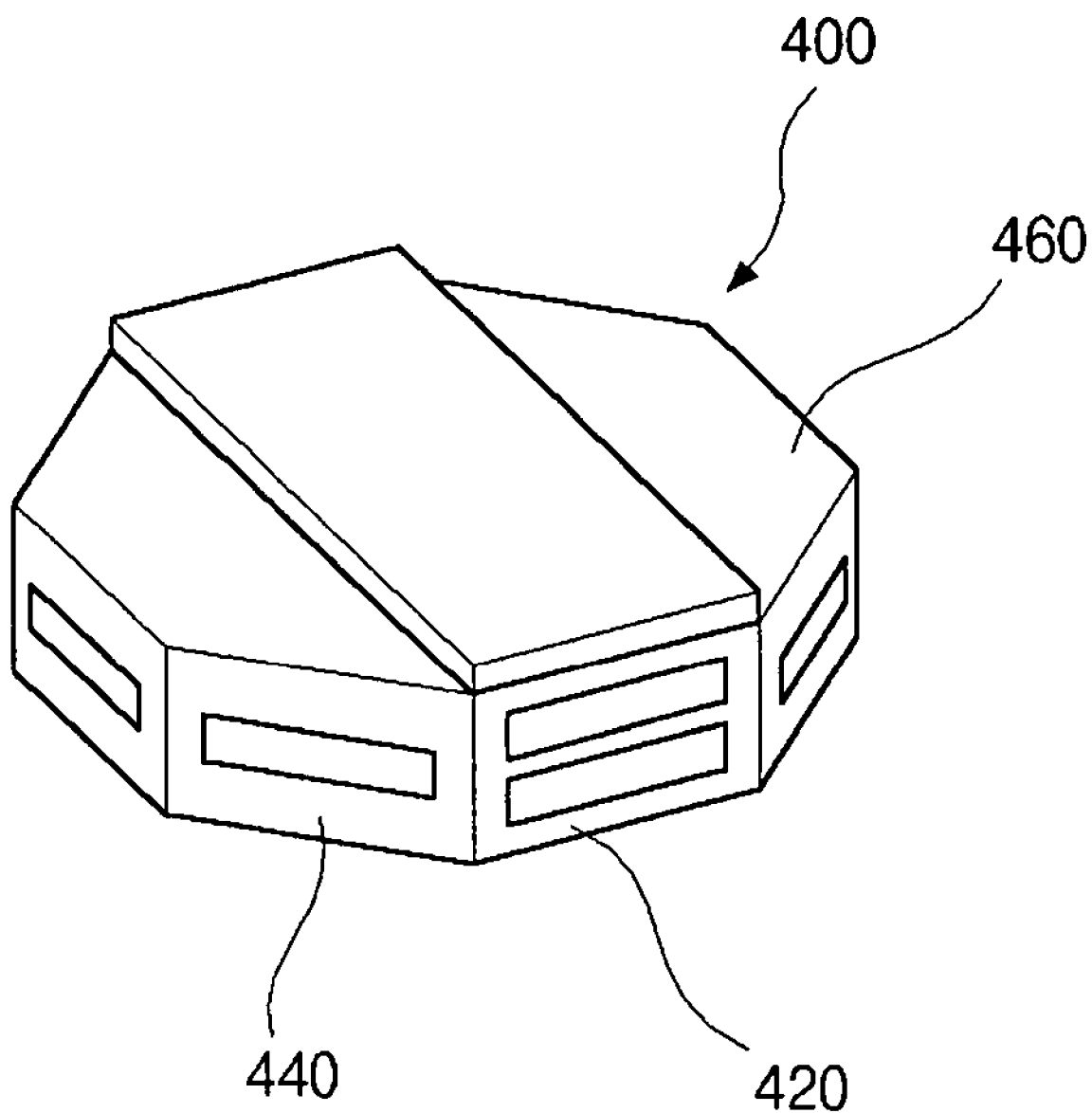
FIG. 5 is a schematic view of a transfer chamber according to a second embodiment of the present invention.

FIG. 5 shows a transfer chamber according to a second embodiment of the present invention.

As shown in FIG. 5, if eight chambers (not shown) including a loadlock chamber and processing chambers are connected to a transfer chamber 400, the transfer chamber 400 may have an octagonal pillar shape. In this case, a first body 420 of the transfer chamber 400 has a rectangular parallelepiped shape, and second and third bodies 440 and 460 of the transfer chamber 400 have a square pillar shape. At this time, upper and lower sides of the second bodies 440 and 460 have a trapezoid shape.

In the present invention, the transfer chamber for the cluster system is manufactured in a separable structure, and a space for a large size substrate is easily obtained. In addition, the manufacturing costs are reduced, and it is easy to set up and transport the cluster system.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A transfer chamber for a cluster system, comprising:
a first body of the transfer chamber;
a second body of the transfer chamber attached at one side of the first body; and
a cover combined with an upper portion of the first body;
wherein the first body has a parallelepiped shape.

2. The chamber according to claim 1, wherein the transfer chamber has a hexagonal pillar shape.

3. The chamber according to claim 1, wherein the first body is a rectangular parallelepiped.

4. The chamber according to claim 1, wherein the transfer chamber has an octagonal pillar shape.

5. The chamber according to claim 1, wherein an O-ring is interposed between the first body and the second body.

6. The chamber according to claim 1, wherein an O-ring is interposed between the first body and the cover.

7. The chamber according to claim 1, further comprising a third body at another side of the first body facing the second body.

8. The chamber according to claim 3, wherein the second body has a triangular prism shape.

9. The chamber according to claim 3, wherein the second body has a square pillar shape.

10. The chamber according to claim 9, wherein upper and lower sides of the second body have a trapezoid shape.

11. The chamber according to claim 7, wherein the third body has the same shape as the second body.

* * * * *